(12) United States Patent
Berroth et al.

(10) Patent No.: US 7,551,036 B2
(45) Date of Patent: Jun. 23, 2009

(54) POWER AMPLIFIER FOR AMPLIFYING HIGH-FREQUENCY (H.F.) SIGNALS

(75) Inventors: Manfred Berroth, Sindelfingen (DE); Lei Wu, Villach (AT)

(73) Assignee: Universitat Stuttgart, Stuttgart (DE)

( * ) Notice: Subject to any disclaimer, the term of this patent is extended or adjusted under 35 U.S.C. 154(b) by 0 days.

(21) Appl. No.: 11/719,893

(22) PCT Filed: Nov. 10, 2005

(86) PCT No.: PCT/EP2005/012021

§ 371 (c)(1),
(2), (4) Date: May 28, 2008

(87) PCT Pub. No.: WO2006/056321

PCT Pub. Date: Jun. 1, 2006

(65) Prior Publication Data

US 2008/0265997 A1   Oct. 30, 2008

(30) Foreign Application Priority Data

Nov. 23, 2004   (DE) .................. 10 2004 056 435

(51) Int. Cl.
*H03F 3/04* (2006.01)
(52) U.S. Cl. ...................... 330/311; 330/310
(58) Field of Classification Search ................ 330/311, 330/295, 124 R, 310
See application file for complete search history.

(56) References Cited

U.S. PATENT DOCUMENTS 6,137,367 A * 10/2000 Ezzedine et al. ............ 330/311
7,071,786 B2 * 7/2006 Inoue et al. .................. 330/311
7,248,120 B2 * 7/2007 Burgener et al. ............ 330/311
7,342,453 B2 * 3/2008 Amasuga et al. ............ 330/277

FOREIGN PATENT DOCUMENTS

| EP | 1087441 A2 | 3/2001 |
|---|---|---|
| EP | 1087441 A3 | 7/2001 |
| WO | 01/56171 A2 | 8/2001 |
| WO | 03/079543 | 9/2003 |

OTHER PUBLICATIONS

Wu L et al., "The integrated 2W high voltage/high Power 0.12mu/m RF CMOS Power Amplifier", 34th European Microwave Conference, The Netherlands, 2004.

* cited by examiner

*Primary Examiner*—Henry K Choe
(74) *Attorney, Agent, or Firm*—Donald R. Boys; Central Coast Patent Agency, Inc.

(57) ABSTRACT

An H.F. power amplifier is disclosed having a plurality of branches (10, 11, 12) switched in parallel. Each branch comprises a plurality of amplifier elements (T1, T4) switched in series. Resistors (R2, R5) enable the voltage (U_DS) applied to the amplifier elements (T1, T4) to be set at a fraction of a supply voltage (Ud) applied to the branches (10, 11, 12). Capacitors (C2, C4) are used to adjust the source impedance of the amplifier elements (T2, T4). In order to prevent the gate-drain voltage (U_GD) from exceeding the breakdown voltage of an amplifier element (T1, T4) and damaging the amplifier element (T1, T4), a limiting path (7) is connected according to the invention between the gate terminal (G) and the drain terminal (D) of the amplifier element (T1, T4), the limiting path (7) being switchable between a conducting state and a blocking state depending on the gate-drain voltage (U_GD).

22 Claims, 6 Drawing Sheets

POWER AMPLIFIER FOR AMPLIFYING HIGH-FREQUENCY (H.F.) SIGNALS

CROSS-REFERENCE TO RELATED DOCUMENTS

The present application claims priority to a German patent application serial number DE 10 2004 056 435.3 entitled "Power Amplifier for Amplifying High-Frequency (H.F.) Signals", which was filed on Nov. 23, 2004, which is incorporated herein in its entirety, at least by reference.

The present invention relates to a power amplifier for amplifying high-frequency (HF) signals comprising:

several amplifier elements, each with an amplifier channel and a gate terminal for controlling the amplifier channel, whereby the amplifier channels of the amplifier elements are connected in series;

a supply voltage for the amplifier elements applied to the serial connection;

a selectable potential applied to a gate terminal of the first amplifier element of the serial connection; an HF input that is connected to the gate terminal of the first amplifier element of the serial connection via a first adjustment network;

an HF output that is connected to a drain terminal of the last amplifier element of the serial connection via a second adjustment network;

at least one capacitor that is connected to ground potential at the gate terminal of the second amplifier element and to the last amplifier element; and at least one resistor, each between the control terminals of adjacent amplifier elements, and at least one resistor between the gate terminal and the drain terminal of the last amplifier element.

A power amplifier designed in this manner is known from U.S. Pat. No. 6,137,367. It can be employed in microwave components for power amplification, or more precisely, in high-performance semiconductor amplifiers. The power amplifier can be used especially in applications requiring particular demands on the output impedance of a component, for example in satellite transmitters, and/or on the available voltage, for example in battery-operated mobile phones or the like.

In practical applications, most components of mobile phones are made utilizing the so-called CMOS technology because it allows for more favorable manufacturing as well as smaller and more compact designs than would be possible using the GaAs technology. However, due to the special electrical requirements of some components in a mobile phone, in particular with regard to electric strength and performance strength, such components must be realized using the GaAs technology according to the current state-of-the-art. Currently, semiconductors made using the GaAs technology can withstand breakdown voltages of more than 8 Volts. In addition, components manufactured using this technology enable a significantly faster electron flow. This means that in particular HF power amplifiers for mobile phones until now are realized using the GaAs technology due to the specific electric requirements. This means also that in addition to the greater manufacturing effort and cost of the components made according to the GaAs technology, components of different technologies must be used in a mobile phone requiring significant expenditures regarding their integration. All in all, there is a great need for a small and cost-effective HF amplifier that can be realized utilizing CMOS technology. To achieve high performance in the CMOS technology, a high dielectric strength is required, which, however, requires a great length of the control electrode (of the channel). However, a great gate length means a low cut-off frequency. To achieve the desired cut-off frequency of a power switch, gate lengths of, for example, only 0.13 µm and below must be used, which in turn reduces the breakdown voltage to only about 1.5 Volt.

In the power amplifier known from the U.S. Pat. No. 6,137,367, the voltage applied to the serial connection is divided between the individual amplifier elements (they can also be designated as semiconductor switches or semiconductor elements and may be designed as transistors, for example), such that the voltage $U_{DS}$ applied to each amplifier element between drain terminal and source terminal is only a fraction of the supply voltage $U_d$ applied to the serial connection. In this manner, an effort is made to keep the voltage $U_{DS}$ applied between drain and source below the breakdown voltage of the amplifier element to avoid an impairment of the functionality of or even damage to the amplifier element.

With the power amplifier known from the state-of-the-art, the resistors are selected such that approximately the same drain-source voltage $U_{DS}$ is present at each amplifier element. This means that each amplifier element operates at the same operating point and that the same current flows through all amplifier elements. Although the voltage $U_{DS}$ applied between drain and source at the operating point of the amplifier elements is of approximately the same magnitude for all amplifier elements, a negative side-effect in practical applications is that in particular the HF voltage $U_{GD}$ applied between the gate terminal and the drain terminal as well as the HF voltage $U_{GS}$ applied between the gate terminal and the source terminal is unevenly distributed at the amplifier elements, thus exceeding the breakdown voltage at one or more of the amplifier elements.

However, at the known power amplifier HF voltages $U_{GD}$ are present between the gate terminal and the drain terminal of some of the amplifier elements, in particular the first and the next to the last amplifier element of the serial connection, which are significantly above the breakdown voltage. This leads to an impairment of the function of or even to damage to the amplifier element and consequently of the entire power amplifier.

It is, therefore, the objective of the present invention to design and develop an HF power amplifier of the kind mentioned above such that it can be realized in CMOS technology with its low gate lengths while meeting the specific electrical requirements.

To accomplish this objective, a power amplifier of the kind mentioned above is recommended that is characterized by at least one limiting path, which is switched between the drain terminal and the gate terminal of at least one amplifier element of the serial connection from the first and up to the next to the last amplifier element, whereby the limiting path can be toggled between a conducting state and an blocking state corresponding to the voltage present between the drain terminal and the gate terminal of the amplifier element.

According to the invention, the circuit of the HF power amplifier is therefore supplemented by a limiting path between drain and gate of at least one of the amplifier elements (except for the last amplifier element). If during the operation of the power amplifier the voltage $U_{GD}$ that is present between gate and drain exceeds a selectable value, preferably a value that is equal to or slightly below the breakdown voltage, then the limiting path will be switched to a conducting state such that the maximum gate-drain voltage $U_{GD}$ is limited (i.e., the gate voltage is raised) in order to achieve a uniform voltage distribution at all amplifier elements of the amplifier and to effectively prevent damage to the amplifier element.

The limiting path must be switchable in some form such that it can be toggled between the conducting state and the blocking state. A switching element of any design may be employed for this purpose such as a transistor or a diode, for example. In addition, the limiting path must exhibit a certain resistance value, which allows the adjustment of the threshold voltage of the switching element together with the threshold voltage of the limiting path.

As soon as during operation of the power amplifier subject to the invention the alternating voltage between the drain terminal and the gate terminal becomes greater than the set threshold voltage of the limiting path, the path will be switched on. The gate voltage is pulled up by the drain voltage. Through the path, a uniform voltage distribution can be achieved across all amplifier elements of the power amplifier. No protective components such as a protection diode, for example are placed in the path to protect the amplifier elements from high voltages. According to the invention, this is achieved in a simple manner by the uniform voltage distribution among the amplifier elements and by pulling up the gate voltage using the drain voltage.

With the first solution of the present invention, the HF power amplifier comprises only one branch with a serial connection of several amplifier elements. For the power amplifier to process greater currents, it is also conceivable to combine several branches into a parallel connection, whereby each of the said branches comprises a serial connection of several amplifier elements. In this sense, a power amplifier of the kind mentioned above is recommended as an additional solution of the objective of the present invention, where said power amplifier is comprised of several branches in parallel connection and of which at least one branch is an input branch and at least one other branch is an output branch, whereby each of said branches is comprised of several amplifier elements each with an amplifier channel and a gate terminal for controlling the amplifier channel, whereby the amplifier channels of the amplifier elements within one branch are connected in series;

the power amplifier comprises an HF input that is connected to the gate terminal of the first amplifier element of the serial connections of the branches via a first adjustment network;

the power amplifier comprises an HF output that is connected to a drain terminal of the last amplifier elements of the serial connection of the branches via a second adjustment network;

each of the branches comprises at least one capacitor connected to ground potential, each at the gate terminal of the second amplifier element to the last amplifier element;

each of the branches comprises at least one resistor between the control connections of adjacent amplifier elements and at least one resistor between the gate terminal and the drain terminal of the last amplifier element; and each of the branches comprises at least one limiting path that is connected between the drain terminal and the gate terminal of at least one of the amplifier elements of the serial connection of the branches from the first amplifier element to the next to the last amplifier element, whereby the limiting path can be toggled between a conducting state and a blocking state corresponding to the voltage that is present between the drain terminal and the gate terminal of the amplifier element.

With this solution subject to the invention, the current flowing through the power amplifier is distributed to the various transistor branches such that in total the power amplifier can process a multiple of the current that flows or can flow through one of the branches. Also with the second embodiment of the invention, at least one limiting path is located in each of the transistor branches such that if required the gate-drain voltage applied to the amplifier element allocated to the limiting path can be limited.

Of course, the limiting path located between the drain terminal and the gate terminal of an amplifier element according to the invention may alternatively or in addition also be located between a source and a gate terminal of a semiconductor switch. A source-gate voltage could then be limited using a limiting path arranged in this manner as soon as it exceeds a selectable threshold value by switching the limiting path to the conducting state. According to one advantageous advancement of the present invention, it is recommended to place a switching element in the limiting path for toggling the limiting path between the conducting state and the blocking state. Preferably, the switching element is to be designed as a semiconductor switch. In particular, the thought is to design the semiconductor switch as a diode.

However, to standardize the production of the circuit of the power amplifier subject to the invention, an alternate recommendation is for the semiconductor switch to exhibit a switching path and a gate terminal to switch the switching path, whereby the gate terminal is hot-wired to a drain terminal of the semiconductor switch. In other words, the semiconductor switch may also be designed as a transistor, where the gate terminal is hot-wired to the drain terminal. A transistor connected in this manner operates like a diode.

It is additionally recommended to place a resistor element in the limiting path. This resistor element may be designed as an ohmic resistor, for example, but may also be designed in any other manner. The threshold voltage can be adjusted by varying the resistance value of the resistor element and the electrical properties of the diode; once the threshold value is exceeded, the limiting path is switched into the conducting state and the gate voltage present in the amplifier element is pulled up by the limiting path.

The limiting path may be connected between the drain terminal and gate terminal of any amplifier elements of the serial connection. According to one preferred embodiment, it is recommended that a limiting path be connected only between the drain terminal and the gate terminal of the next to the last amplifier element of the serial connection. It can be demonstrated mathematically and supported by practical experiments that with a serial connection of the amplifier channels of several amplifier elements of the power amplifier subject to the invention, the drain-gate voltage assumes greater values at the next to the last amplifier elements than at the other amplifier elements of the serial connection. The voltage building up between the gate terminal and the drain terminal of the next to the last amplifier element can easily exceed 1.5 Volt, i.e., exceeds the breakdown voltage of a CMOS amplifier element with a gate length of less than 0.13 µm. Thus, the next to the last amplifier element of a serial connection is the amplifier element of the serial connection that is most vulnerable. Thus, if a limiting path is connected between the drain terminal and the gate terminal of precisely this most vulnerable amplifier element of the serial connection, an impairment of the function of or even damage to the amplifier element, and in turn of the power amplifier, can be avoided reliably in most cases.

According to another preferred embodiment of the present invention, it is recommended to connect a first limiting path between the drain terminal and the gate terminal of the next to the last amplifier element and an additional limiting path between the drain terminal and the gate terminal of the first amplifier element of the serial connection. It can be demonstrated theoretically and supported by practical experiments that after the next to the last amplifier element, the first amplifier element of the serial connection is particularly vulnerable for an excessive gate-drain voltage. With the recommended embodiment, a limiting path is connected into the two most vulnerable amplifier elements, namely the next to the last and the first amplifier element of the serial connection, such that if needed, the gate-drain voltage present at these amplifier elements can be effectively limited, thus avoiding an impairment of the function of or even damage to these amplifier elements, and in turn of the entire power amplifier.

According to an additional preferred embodiment of the present invention, it is recommended that a limiting path each is connected between the drain terminal and the gate terminal from the first amplifier element to the next to the last amplifier element of the serial connection. Thus, according to this embodiment, a limiting path is provided between gate and drain for all amplifier elements of the serial connection with the exception of the last amplifier element, such that in all cases and under all conditions damage to the amplifier elements and in turn to the entire power amplifier due to excessive drain-gate voltages can be avoided reliably.

For a power amplifier subject to the invention exhibiting several branches, it is particularly advantageous if, with the exception of the initial starting branch, at least one of the branches can be switched in or out as a function of a desired output power of the power amplifier. The output power of the power amplifier can then be varied by targeted adding or removing of individual branches of the power amplifier circuit. Such a variation of the output power is necessary with mobile phones, for example, to ensure a secure and reliable signal transmission even with poor connections to an antenna of a base station, for example in narrow street canyons or inside buildings. In such cases, the transmission is carried out using a higher output power. However, this is coupled with increased energy consumption and for this reason the output power is lowered when the reception conditions are better in order to prolong the service life of the energy storage. A variation of the output power is possible in a particularly simple manner when using the recommended switching in and out of individual branches of the circuit of the power amplifier subject to the invention.

An additional advantage of the variation of the output power of the power amplifier by adding or removing individual branches is that the power amplifier subject to the invention operates always at a good efficiency, in an ideal case even at optimum efficiency, regardless of the number of enabled branches, i.e., independent of the output power present at a given moment. This is due to the fact that the entire direct current is scaled by the number of active branches, thus keeping the efficiency largely uniform. This is different with the power amplifiers known from the state-of-the-art. The amplification of a known power amplifier remains always constant due to its constant gate width. The variation of the output power stems only from the various input powers, which are equal to the output powers of a variable preamplifier. A typical variable preamplifier is, for example, a programmable gain amplifier (PGA) or a variable gain amplifier (VGA). For this reason, the power amplifier cannot always operate at optimum efficiency when its output power is varied via the preamplifier. With the known power amplifiers, a reduction of the output power must always be bought with a decrease in the efficiency.

Finally, it is recommended that the entire circuit of the power amplifier be designed in CMOS (Complementary Metal Oxide Semiconductor) technology. CMOS is also called a metal oxide semiconductor with complementary connectors. Only because of the design of the power amplifier subject to the invention, in particular through the use of limiting paths, is it possible to build the power amplifier with very high output powers in CMOS technology with a very short gate length, without the risk of a impairment of the function of or even damage to the amplifier elements and in turn of the entire power amplifier. Enabling and disabling of individual branches of the power amplifier subject to the invention can also be realized in a very simple manner in CMOS technology by simply reversing or reducing to zero the polarities present at a CMOS gate. In this manner, the branches can be easily enabled or disabled using voltage reversal or voltage off switching.

Due to the fact that with the present invention it is now for the first time possible to manufacture a HF power amplifier with a very high output power in CMOS technology with very short gate lengths, it has now become possible to manufacture all components of a complete system, e.g., of a mobile phone, including the HF power amplifier, highly integrated on one single semiconductor component (chip). Aside from significantly lower manufacturing costs and the reduced space requirements, this also has the advantage that the one chip can be handled much better during the production of the mobile phone than the previously several components manufactured with different technologies.

The Figures show preferred exemplary embodiments of the present invention. Said embodiments are explained in greater detail based on the description of the Figures, of which FIG. 1 shows a circuit of a first preferred embodiment of a power amplifier subject to the invention;

Figure 5:
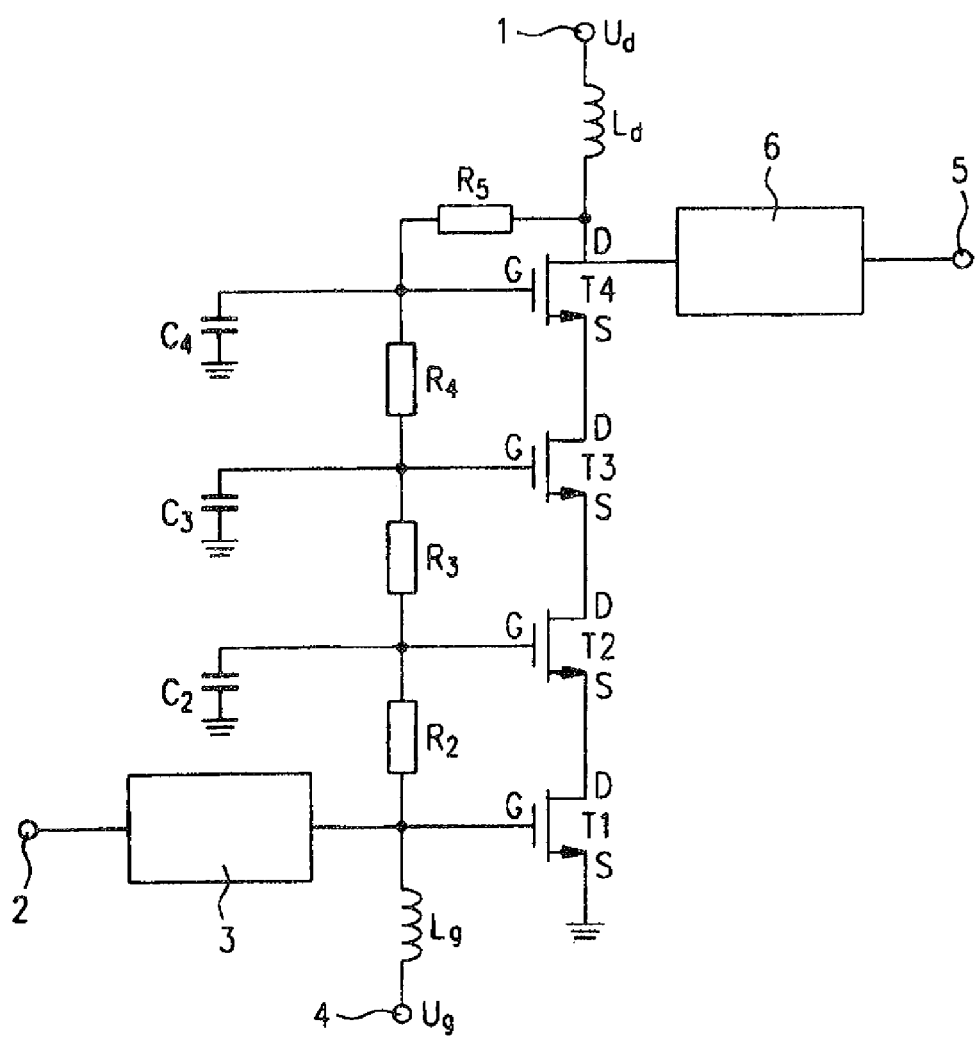
FIG. 5 shows a circuit of a power amplifier known from the state-of-the-art.

FIG. 5 shows a circuit of a power amplifier like the one known from U.S. Pat. No. 6,137,367, for example. The power amplifier is used for amplifying high frequency (HF) signals, for example, of transmission signals in mobile phones. The known power amplifier comprises several amplifier elements T1 to T4, each exhibiting an amplifier channel and a gate terminal for controlling the amplifier channel. The amplifier elements may be designed as semiconductor elements, preferably as transistors. The amplifier channels of the transistors T1 to T4 are located between the drain terminal D and the source terminal S of the transistors. The amplifier channels of the transistors T1 to T4 are connected in series.

A supply voltage Ud for the amplifier elements T1 to T4 is applied at a first terminal 1 at the end of the serial connection via a coil Ld. Using the choke coil Ld, the direct portion of a current can flow into the power amplifier, whereby a high frequency input signal in the counter-direction is blocked. The source terminal S of the first transistor T1 at the other end of the serial connection is connected to ground potential.

In addition, the known power amplifier includes an HF input 2 that is connected to the gate terminal G of the first amplifier element $T_1$ of the serial connection via a first adjustment network 3. A selectable potential $U_g$ is present at the gate terminal G of the first transistor $T_1$ via a second choke coil $L_g$ at a second terminal 4. The choke coils $L_d$ and $L_g$ have the main purpose of avoiding a loss in HF energy. In addition, the circuit comprises an HF output 5 that is connected to a drain connected D of the last amplifier element $T_4$ of the serial connection via a second adjustment network 6. The adjustment networks 3, 6 serve primarily the purpose of adjusting the impedance of the shown circuit to the input impedance at the HF input 2 and to the output impedance at the HF output 5.

The known power amplifier comprises furthermore three capacitors $C_2$ to $C_4$. With the second amplifier element $T_2$ and to the last amplifier element $T_4$ of the serial connection, each of the control connections G are applied to ground potential via one of the capacitors $C_2$ to $C_4$.

Finally, the circuit also comprises three resistors $R_2$ to $R_4$, whereby one of the resistors $R_2$ to $R_4$ each is connected between the control connections G of in the serial connection successive amplifier elements $T_1$, $T_2$; $T_2$, $T_3$; $T_3$, $T_4$.

At the last transistor $T_4$, the drain terminal D is connected to the gate terminal G as a feedback via an additional resistor $R_5$. However, compared to the other resistors $R_2$ to $R_4$, the additional resistor is small, in some cases even negligibly small. In such a case, the resistor $R_5$ can be replaced by an electrical line.

The circuit of a known power amplifier shown in FIG. 5 is designed in the GaAs technology. The voltage between the drain terminal D and the source terminal S of an amplifier element $T_1$ to $T_4$ connected in series is limited to values of approximately 10 Volt. Accordingly, the supply voltage $U_d$ is divided by the resistors $R_2$ to $R_5$ connected in series such that a suitable drain-source voltage $U_{DS}$ is present at each of the transistors $T_1$ to $T_4$. This means that the resistors $R_2$ to $R_5$ function as voltage dividers.

The resistors $R_2$ to $R_5$ are set such that the transistors $T_1$ to $T_4$ operate at their respective operating points. This means that the drain-source voltages $U_{DS}$, which are present at the transistors $T_1$ to $T_4$ of the serial connection are of equal magnitude, which also applies to the currents flowing through the transistors $T_1$ to $T_4$.

Different source impedances of the transistors $T_2$ to $T_4$ are set using the capacitors $C_2$ to $C_4$ to provide the transistors with different HF drain voltages. In other words, by varying the capacities of the capacitors $C_2$ to $C_4$, the large HF drain voltage is distributed to all transistors $T_1$ to $T_4$. However, with the transistors $T_1$ to $T_4$, the voltages $U_{GD}$ and $U_{GS}$ that are present between gate and drain or between gate and source, respectively can assume relatively large values of several Volts if the output power is very high. This is a problem in particular if one were to attempt to design the circuit known from the state-of-the-art in CMOS technology. The problem is aggravated if one were to attempt to use smaller-built transistors $T_1$ to $T_4$, i.e., transistors with a shorter gate length in a range of below 0.15 μm and thus also thinner oxide coatings of the gate G. For transistors with a gate length of 0.12 μm, the breakdown voltage is about 1.5 V.

Figure 6:
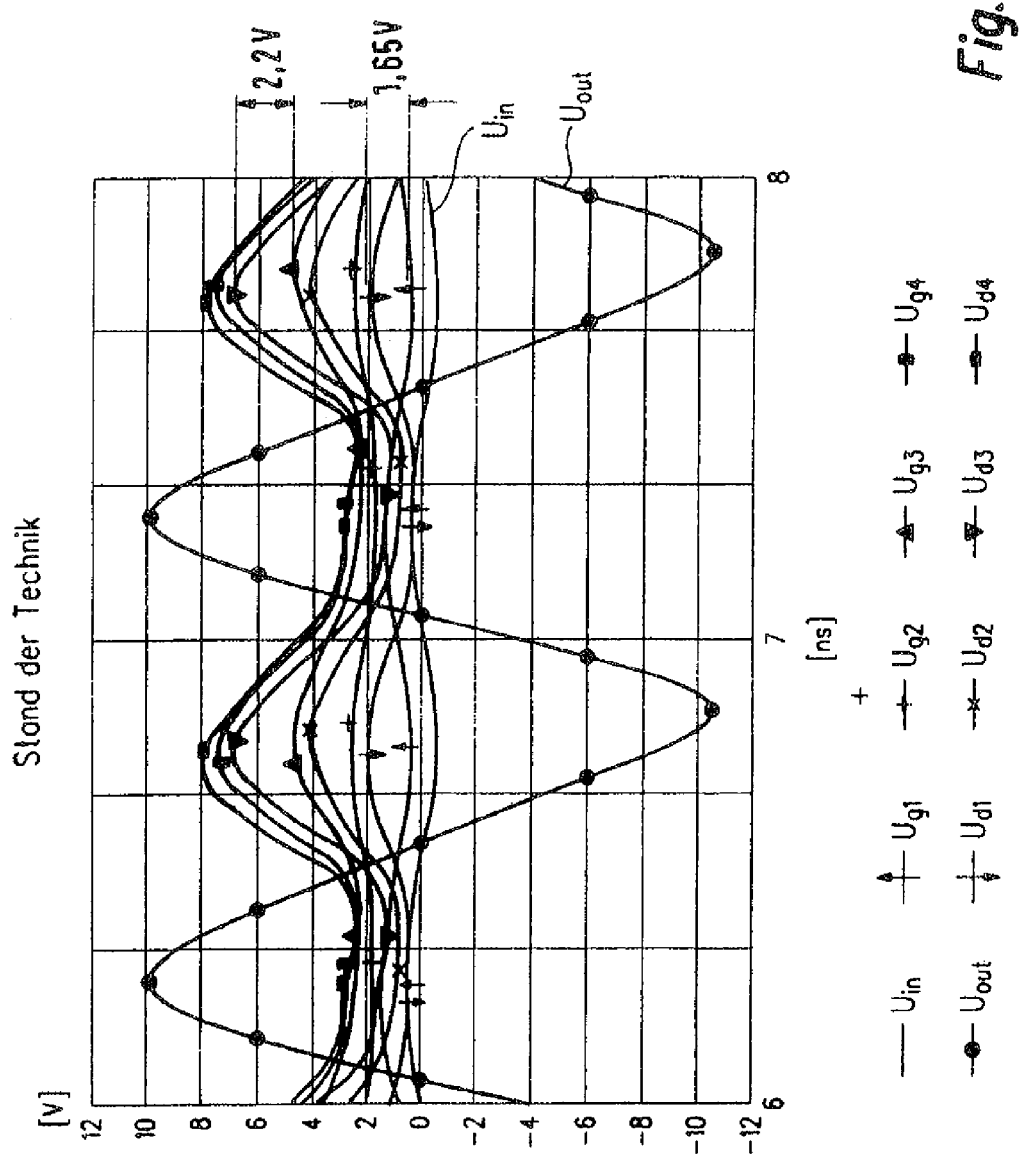
FIG. 6 shows voltage profiles at gate and drain of the amplifier elements of the power amplifier known from the state-of-the-art according to FIG. 5.

FIG. 6 shows different voltage profiles of the circuit in 0.12 μm CMOS technology according to the embodiment of FIG. 5. The voltage profiles were plotted over a time frame of 2 nanoseconds (ns). The voltage is plotted in Volt (V). Initially, FIG. 6 shows the input voltage $U_{in}$ present at HF input 2 and the resulting output voltage $U_{out}$ at the HF output 5. Additionally plotted for the four transistors $T_1$ to $T_4$ are the gate potentials $U_{gi}$ (i=1 ... 4 for the transistors $T_1$ to $T_4$) present at the gates G, as well as the drain potential $U_{di}$ present at the drain terminal D. In FIG. 6, it is readily apparent that the gate-drain voltage $U_{GD}$, which results from the difference of the gate potential $U_{gi}$ and the drain potential $U_{di}$, of all transistors $T_1$ to $T_4$ is largest at the next to the last transistor $T_3$. In the present exemplary embodiment, the gate-drain voltage $U_{GD}$ at the next to the last transistor $T_3$ reaches a value of 2.2 V, i.e., the voltage $U_{GD}$ far exceeds the permitted breakdown voltage of about 1.5 V. The gate-drain voltage $U_{GD}$ at the first transistor with a value of 1.65 V is also significantly above the permitted breakdown voltage of a transistor that has been made using the 0.12 μm CMOS technology.

Thus, FIG. 6 demonstrates that the circuit known from the state-of-the-art is not suited to be realized in CMOS technology with a short gate length for an HF power amplifier due to the irregular voltage distribution. Because there is a great demand on HF power amplifiers, which on the one hand operate securely and reliably and on the other hand exhibit a simple design and can be manufactured at reasonable cost, it is desirable to design and advance the known circuit of an HF power amplifier shown in FIG. 5 such that a realization in CMOS technology is possible with very short gate lengths and without sacrificing the functionality. To solve this task, it is recommended according to the invention to connect a limiting path 7 between the drain terminal D and the gate terminal G of at least one of the amplifier elements of the first amplifier element $T_1$ and up to the next to the last amplifier element $T_3$ (i.e., not to the last amplifier element $T_4$).

Figure 1:
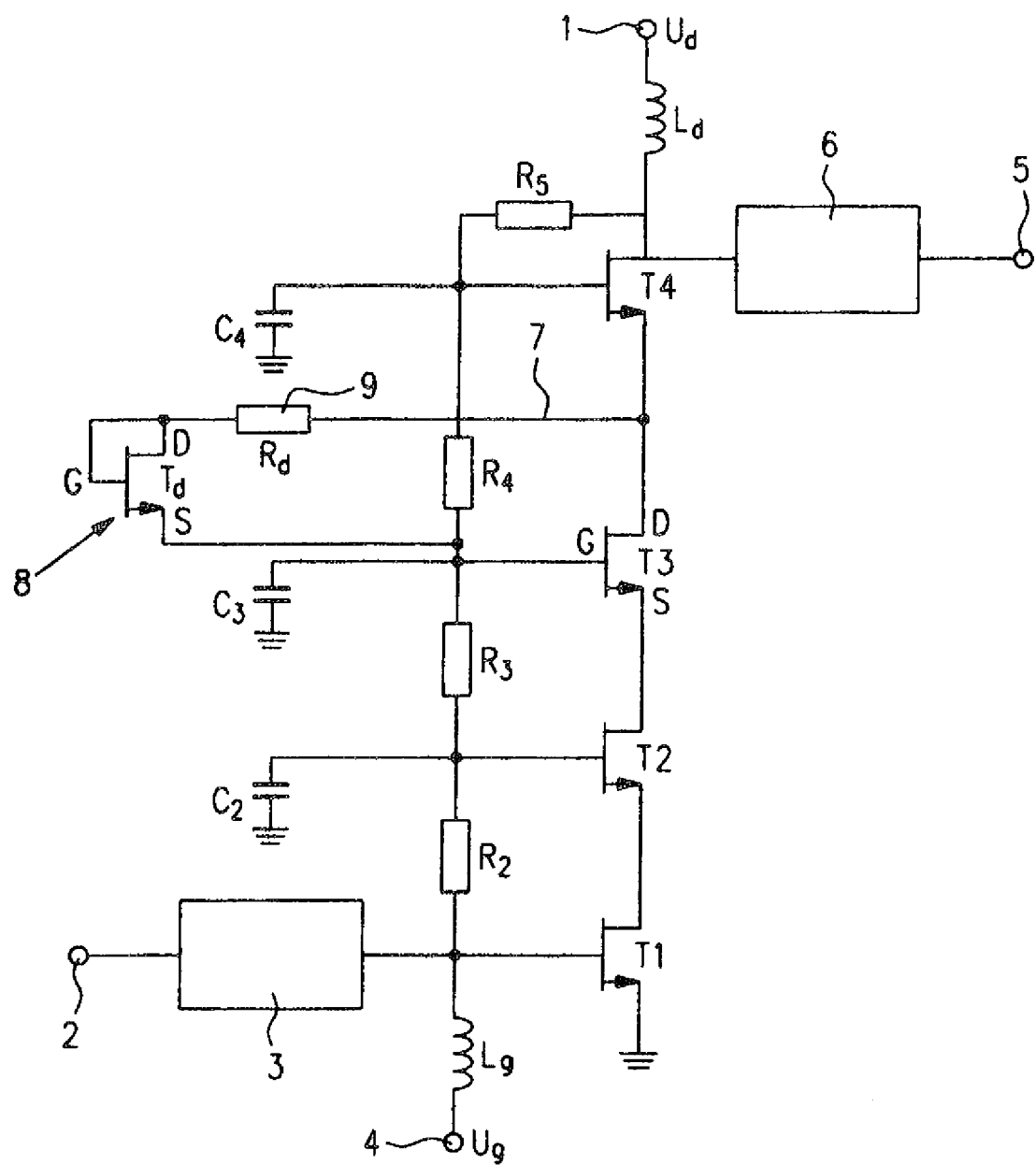

A circuit of an HF power amplifier subject to the invention according to a first preferred embodiment is shown in FIG. 1. For the same components, the same reference characters are used as in FIG. 5. With the invention shown in FIG. 1, only one limiting path 7 is connected between the drain terminal D and the gate terminal G of the next to the last transistor $T_3$. The limiting path 7 can be toggled between a conducting state and a blocking state as a function of the gate-drain voltage $U_{GD}$ that is present between the gate terminal G and the drain terminal D of the transistor $T_3$. A switching element 8 is placed in the line 7 for switching the limiting path 7, where said switching element may be designed as a semiconductor switch, for example, and preferably as a diode. In the exemplary embodiment presented in FIG. 1, the switching element 8 is designed as a semiconductor switch, preferably as a transistor $T_d$, where a drain terminal D is hot-wired to the gate terminal G. A transistor $T_d$ connected in this manner functions like a diode.

Furthermore, an additional resistor element 9 with a resistance value $R_d$ is located in the limiting path 7. Preferably, the resistor element 9 is designed as an ohmic resistor. If required, the maximum value of the gate-drain voltage $U_{GD}$ that is present at the next to the last transistor $T_3$ can be limited via the resistor element 9 and the switching element 8. The removed voltage portion can be distributed across the other transistors $T_1$, $T_2$ and $T_4$.

The threshold voltage at which the limiting path switches from the blocking state to the conducting state can be set by suitable dimensioning of the resistor value $R_d$ of the resistor element 9 and the dimension (gate length and thickness of the gate oxide coating) of the transistor $T_d$. Preferably, the breakdown voltage of the transistors $T_1$ to $T_4$ or a slightly lower voltage value than the breakdown voltage is selected as the threshold voltage of the limiting path 7 in order to ensure that the limiting path 7 switches to the conducting state in time before reaching the breakdown voltage.

If the gate-drain voltage $U_{GD}$ becomes greater than this threshold voltage, the limiting path 7 is switched automatically into the conducting state. As a result, the gate potential $U_g$ is pulled up by the drain potential $U_d$ (the so-called boosting). However, it is also conceivable that the gate terminal G of the transistor $T_3$ is positively biased. In this case, the gate-drain voltage $U_{GD}$ of the next to the last transistor $T_3$ is reduced.

With the circuit shown in FIG. 1, the serial connection comprises four transistors $T_1$ to $T_4$. Of course, the present invention may also be realized using more or fewer than four transistors. Furthermore, it would also be possible to alternatively or in addition to the limiting path 7 between the drain terminal D and the gate terminal G of one or more of the amplifier elements $T_2$ to $T_4$ to connect one or more additional limiting paths between the source terminal S and the gate terminal G of the amplifier elements $T_2$ to $T_4$. This additional limiting path would also exhibit a switching element for toggling the limiting paths between a conducting state and a blocking state and a resistor element that is used together with the dimension of the switching element to set the threshold voltage of the limiting path.

With the circuit shown in FIG. 1, the limiting path 7 is connected between the gate terminal G and the drain terminal D of the next to the last transistor $T_3$. Alternatively, the limiting path 7 could also be connected between the gate terminal G and the drain terminal D of the second transistor $T_2$ or of the first transistor $T_1$. However, it is prudent to select the next to the last transistor $T_3$ for the limiting path 7 because the gate-drain voltage $U_{GD}$ that occurs during the operation of the HF power amplifier is larger at the next to the last transistor $T_3$ than at any other transistor $T_1$, $T_2$ and $T_4$ (cf. FIG. 6). This is also the case when the serial connection comprises only three transistors or five or even more transistors.

Figure 2:
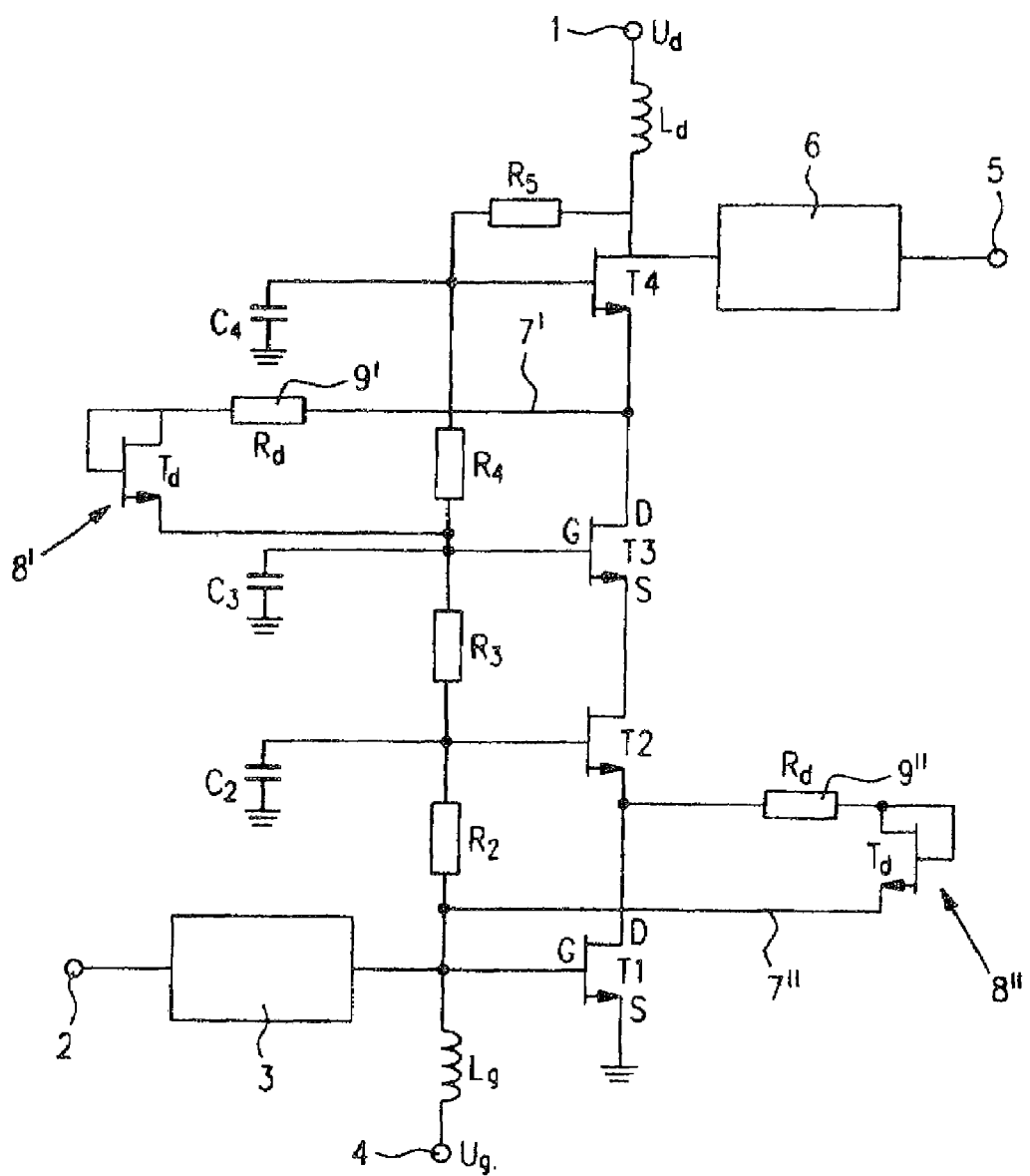
FIG. 2 shows a circuit of a second preferred embodiment of a power amplifier subject to the invention.

FIG. 2 shows a circuit of an HF power amplifier subject to the invention according to a second preferred embodiment, whereby in addition to the first limiting path 7' between the gate terminal G and the drain terminal D of the next to the last transistor $T_3$, an additional limiting path 7" is connected between the gate terminal G and the drain terminal D of the first transistor $T_1$. The additional limiting path 7" also features a switching element 8" and a resistor element 9" with a resistance value $R_d$. Placing an additional limiting path 7" between the gate G and the drain D of the first transistor $T_1$ is prudent because after the next to the last transistor $T_3$, the first transistor $T_1$ is the transistor with the highest gate-drain voltage $U_{GD}$ during the operation of the HF power amplifier (cf. FIG. 6). The additional limiting path 7" prevents the gate-drain voltage $U_{GD}$ that is present at the first transistor $T_1$ from exceeding the breakdown voltage of the transistor and impairs its functionality or even damages it.

Figure 3:
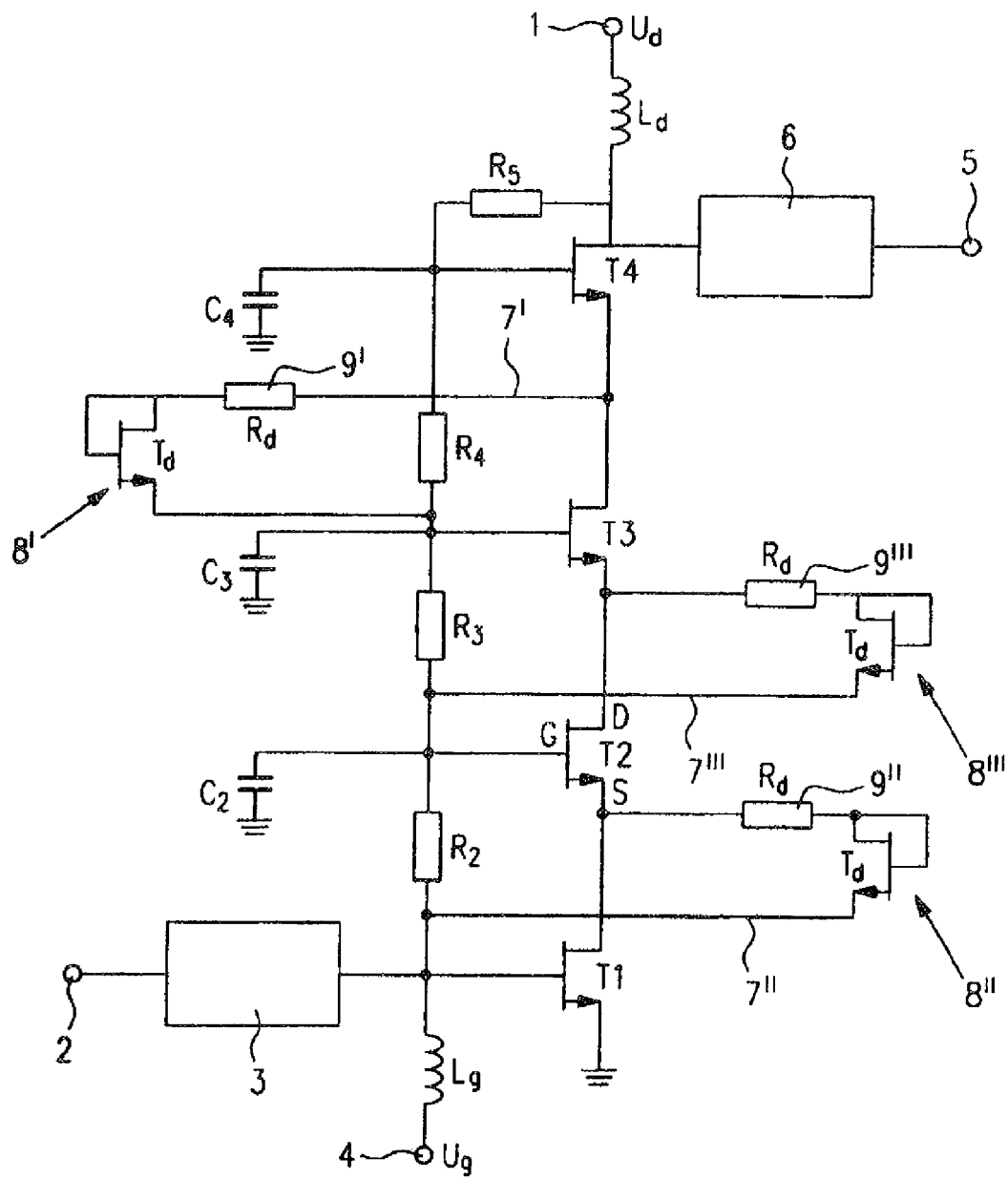
FIG. 3 shows a circuit of a third preferred embodiment of a power amplifier subject to the invention.

FIG. 3 shows a circuit of an HF power amplifier subject to the invention according to a third preferred embodiment. In addition to the first limiting path 7' and the second limiting path 7", a third limiting path 7''' is connected in the circuit of FIG. 3 between the gate terminal G and the drain terminal D of the second transistor $T_2$. The third limiting path 7''' also features a switching element 8''' and a resistor element 9''' with a resistance value $R_d$. The third limiting path 7''' prevents the gate-drain voltage $U_{GD}$ that is present at the second transistor $T_2$ from exceeding the breakdown voltage of the transistor. With the circuit of the HF power amplifier shown in FIG. 3, all but the last transistor $T_4$ of the serial connection, from the first transistor $T_1$ to the next to the last transistor $T_3$ exhibit a limiting path 7.

In the exemplary embodiments of FIGS. 1 to 3, the shown HF power amplifier exhibits only one branch with several transistors $T_1$ to $T_4$ in serial connection. Various measures are conceivable to increase the current that may flow through the power amplifier. For one, it is possible to increase the width of the transistor, or more precisely the width of the gate terminal G, such that more electrons are capable of flowing parallel across the gate terminal G. In this example, the gate length and the thickness of the gate oxide coating remain the same such that the breakdown voltage remains the same as well. Conventional transistors in CMOS technology exhibit a typical gate width of less than 500 µm. For mobile phone applications, for example, it is necessary that the HF power amplifier subject to the invention is capable of processing currents of about 1 A such that output powers of about 2 W are possible. It becomes necessary to increase the gate width to several millimeters. For example, a gate width of 3.4 mm is conceivable.

Figure 4:
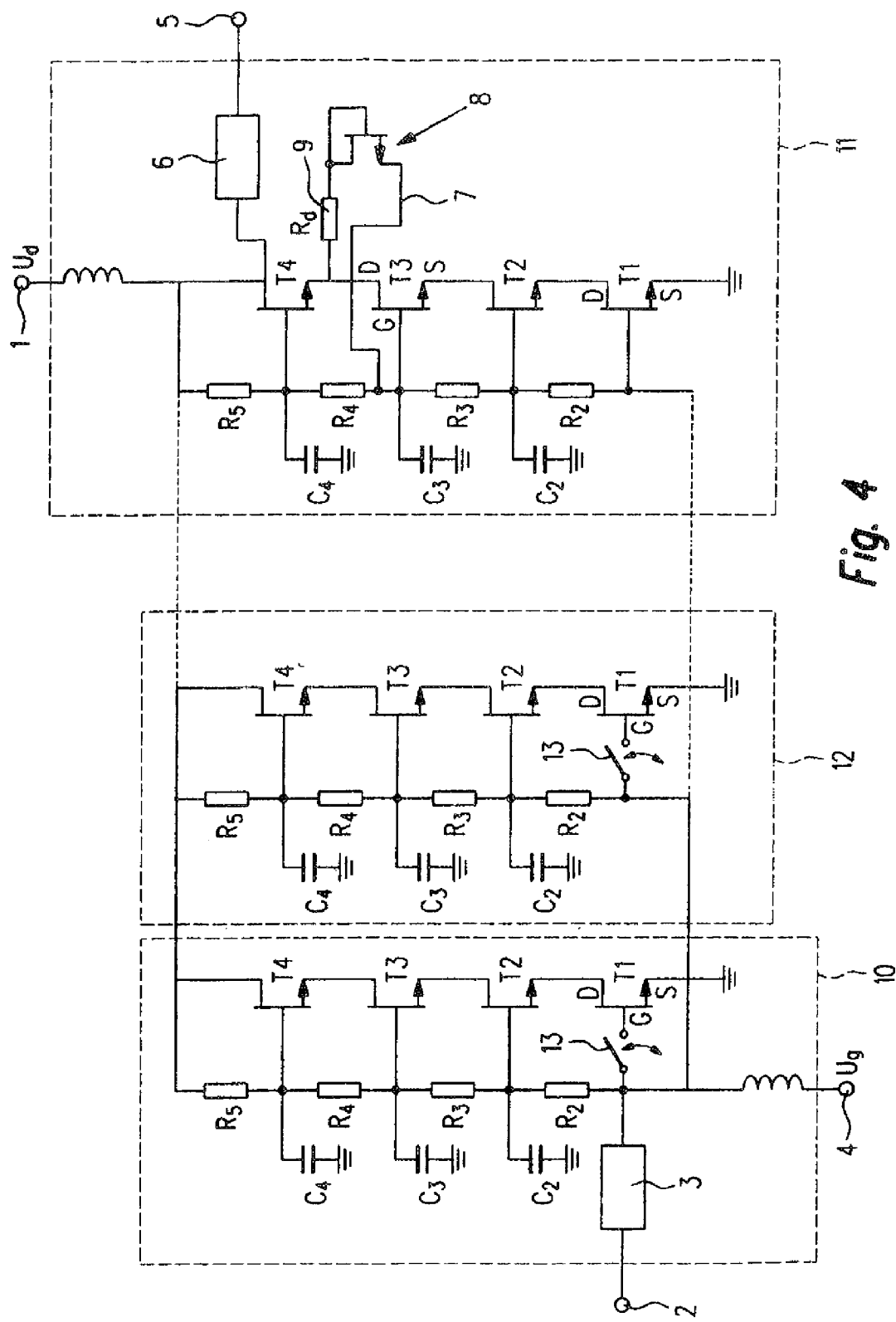
FIG. 4 shows a circuit of a fourth preferred embodiment of a power amplifier subject to the invention.

As an additional measure to increase the current that can be processed by the power amplifier, it is possible to connect parallel adjacent to one another several branches each with several amplifier elements $T_1$ to $T_4$ connected in series. An example of an HF power amplifier designed in this manner is shown in FIG. 4. The presented power amplifier comprises an input branch 10 and an output branch 11. In the present exemplary embodiment, an additional branch 12 is connected parallel to the two other branches 10, 11 between the input branch 10 and the output branch 11. Of course, it is also possible to provide more additional branches 12 (indicated by the dotted connecting lines between the additional branch 12 and the output branch 11) or only the two branches 10, 11.

Each of the branches 10 to 12 comprises several amplifier elements that may be designed as a semiconductor switch, for example, preferably as transistors $T_1$ to $T_4$. Each amplifier element $T_1$ to $T_4$ exhibits an amplifier channel between the drain terminal D and the source terminal S and a gate terminal G for controlling the amplifier channel DS. The amplifier channels DS of the amplifier elements $T_1$ to $T_4$ within a branch 10, 11, 12 are switched in series. The power amplifier includes the HF input that is connected to the gate terminal G of the first amplifier elements $T_1$ of the serial connections of the branches 10, 11, 12 via the first adjustment network 3. In addition, the power amplifier includes the HF output 5 that is connected to the drain terminals D of the last amplifier elements T4 of the serial connections of the branches 10, 11, 12 via the second adjustment network 6.

Each of the branches 10 to 12 comprises at least one capacitor $C_2$ to $C_4$ connected to ground potential, each at the gate terminal G from the second amplifier element $T_2$ and to the last amplifier element $T_4$. An addition, each of the branches 10 to 12 comprises three resistors $R_2$ to $R_4$, each between the control connections G of adjacent amplifier elements $T_1$ to $T_4$ and a resistor $R_5$ between the gate terminal G and the drain terminal D of the last amplifier element $T_4$.

Each of the branches 10 to 12 comprises at least one limiting path 7, however, for purposes of better clarity, FIG. 4 shows only a limiting path 7 for the next to the last amplifier element $T_3$ of the output branch. Each of the branches 10 to 12 of the circuit shown in FIG. 4 may, however, also be designed according to one of the embodiments shown in FIGS. 1 to 3 and may exhibit one, two or three limiting paths 7.

With the embodiment of the HF power amplifier subject to the invention shown in FIG. 4, the output power present at the HF output 5 can be varied in a particularly easy manner. To this end—with the exception of output branch 11—individual branches 10, 12 of the circuit are enabled or disabled according to the desired output power of the power amplifier. In the exemplary embodiment shown in FIG. 4, the input branch 10 and the additional branch 12 can be enabled or disabled. For the targeted enabling or disabling of the branches 10, 12, a switching element 13 is placed between the first adjustment network 3 and the gate terminal G of the first amplifier element $T_1$ of the branches 10, 12, where said switching element can be actuated relative to the desired output power of the power amplifier.

The switching element 13 can be designed as a semiconductor switch, for example, in particular as a transfer gate. By opening and closing the switching elements 13, the entire branch 10 or 12, respectively, can be enabled or disabled. When the switching elements 13 are open in both branches 10, 12, the circuit presented in FIG. 4 corresponds to the circuits presented in FIGS. 1 to 3 with only one branch, namely output branch 11. Controlling of the switching elements 13 can be carried out, for example, via a superordinate control unit of the mobile phone.

With the present invention, it is now possible for the first time to realize an HF power amplifier such as the one known from U.S. Pat. No. 6,137,367, for example, in CMOS technology with a very low gate length. This means that it is possible in mobile phones, for example, to design all components, in particular also the HF power amplifier, in CMOS technology and thus, to design in highly integrated on one single semiconductor component (chip). In this manner, the manufacturing expenditures and the costs for the HF power amplifiers and entire mobile phones can be reduced significantly.

The invention claimed is:

1. A power amplifier for amplifying high frequency (HF) signals comprising:
    several amplifier elements (T_1, . . . , T_4) each with an amplifier channel (DS) and a gate terminal (G) for controlling the amplifier channel (DS), whereby the amplifier channels (DS) of the amplifier elements (T_1, . . . , T_4) are connected in series;
    a supply voltage (U_d) for the amplifier elements (T_1, . . . , T_4) that is applied to the serial connection;
    a selectable potential (U_g) that is present at the gate terminal (G) of the first amplifier element (T_1) of the serial connection;
    an HF input (2) that is connected to the gate terminal (G) of the first amplifier element (T_1) of the serial connection via a first adjustment network (3);
    an HF output (5) that is connected to a drain (D) of the last amplifier element (T_4) of the serial connection via a second adjustment network (6);
    at least one capacitor (C_2, . . . , C_4) connected to ground potential, each at the gate terminal (G) of the second amplifier element (T_2) and to the last amplifier element (T_4); and
    at least one resistor (R_2, . . . , R_4), each between the gate terminals (G) of adjacent amplifier elements (T_1, T_2; T_2, T_3; T_3, T_4), at least one resistor (R_5) between the gate terminal (G) and the drain terminal (D) of the last amplifier element (T_4),
    characterized by at least one limiting path (7) that is connected between the drain terminal (D) and the gate terminal (G) of at least one amplifier element of the serial connection from the first amplifier element (T_1) to the next to the last amplifier element (T_3), whereby the limiting path (7) can be toggled between a conducting state and a blocking state corresponding to a voltage (U_$_{GD}$) that is present between the drain terminal (D) and the gate terminal (G) of the amplifier elements (T_1, . . . , T_3).

2. A power amplifier for amplifying high frequency (HF) signals comprising:
    several amplifier elements (T_1, . . . , T_4) each with an amplifier channel (DS) and a gate terminal (G) for controlling the amplifier channel (DS), whereby the amplifier channels (DS) of the amplifier elements (T_1, . . . , T_4) are connected in series;
    a supply voltage (U_d) for the amplifier elements (T_1, . . . , T_4) that is applied to the serial connection;
    a selectable potential (U_g) that is present at the gate terminal (G) of the first amplifier element (T_1) of the serial connection;
    an HF input (2) that is connected to the gate terminal (G) of the first amplifier element (T_1) of the serial connection via a first adjustment network (3);
    an HF output (5) that is connected to a drain terminal (D) of the last amplifier element (T_4) of the serial connection via a second adjustment network (6);
    at least one capacitor (C_2, . . . , C_4), whereby at the second amplifier element (T_2) and to the last amplifier element (T_4) of the serial connection, the gate terminals (G) are each connected to ground potential via one of the capacitors (C_2, . . . , C_4); and
    at least one resistor (R_2, . . . , R_4), whereby one of the resistors (R_2, . . . , R_4) each is connected between the gate terminals (G) of the amplifier elements (T_1, T_2; T_2, T_3; T_3, T_4) that succeed each other in the serial connection, and at least one resistor (R_5) between the gate terminal (G) and the drain terminal (D) of the last amplifier element (T_4),
    characterized in that the power amplifier comprises several transistor branches (10, 11, 12) connected to each other in parallel, where one branch (10) is an input branch and another branch (11) is an output branch, whereby
        each of the branches (10, 11, 12) comprises several amplifier elements (T_1, . . . , T_4), each with an amplifier channel (SD) and the gate terminal (G) for controlling the amplifier channel (SD), whereby the amplifier channels (SD) of the amplifier elements (T_1, . . . , T_4) within a branch (10; 11; 12) are connected in series;
        the power amplifier comprises an HF input (2) that is connected to the gate terminal (G) of the first amplifier elements (T_1) of the serial connection of the branches (10, 11, 12) via a first adjustment network (3);
        the power amplifier comprises an HF output (5) that is connected to the drain (D) of the last amplifier elements (T_4) of the serial connection of the branches (10, 11, 12) via a second adjustment network (6);
        each of the branches (10, 11, 12) comprises at least one capacitor (C_2, . . . , C_4) connected to ground potential each at the gate terminal (G) of the second amplifier element (T_2) and to the last amplifier element (T_4);
        each of the branches (10, 11, 12) comprises at least one resistor (R_2, . . . , R_4), each between the gate terminals (G) of adjacent amplifier elements (T_1, T_2; T_2, T_3; T_3, T_4) and at least one resistor (R_5) between the gate terminal (G) and the drain terminal (D) of the last amplifier element (T_4); and
        each of the branches (10, 11, 12) comprises at least one limiting path (7), that is connected between the drain terminal (D) and the gate terminal (G) of at least one of the amplifier elements of the serial connection of all branches (10, 11, 12) from the first amplifier element (T_1) to the next to the last amplifier element (T_3), whereby the limiting path (7) can be toggled between a conducting state and a blocking state corresponding to a voltage (U_$_{GD}$) that is present between the drain terminal (D) and the gate terminal (G) of the amplifier elements (T_1, . . . , T_3).

3. A power amplifier as set forth in claim 1, characterized in that a switching element (8) for toggling the limiting path (7) between the conducting state and the blocking state is located in the limiting path (7).

4. A power amplifier as set forth in claim 3, characterized in that the switching element (8) is designed as a semiconductor switch (T_d).

5. A power amplifier as set forth in claim 4, characterized in that the semiconductor switch (T_d) is designed as a diode.

6. A power amplifier as set forth in claim 4, characterized in that the semiconductor switch (T_d) exhibits a switching path (DS) and a gate terminal (G) for switching the switching path (DS), whereby the gate terminal (G) is hot-wired to a drain terminal (D) of the semiconductor switch (T_d).

7. A power amplifier as set forth in one of the claim 1, characterized in that a resistor element (9) is located in the limiting path (7).

8. A power amplifier as set forth in one of the claim 1, characterized in that a limiting path (7) is connected only between the drain terminal (D) and the gate terminal (G) of the next to the last amplifier element (T_3) of the serial connection.

9. A power amplifier as set forth in one of the claim 1, characterized in that a first limiting path (7') is connected between the drain terminal (D) and the gate terminal (G) of the next to the last amplifier element (T_3) and an additional limiting path (7") between the drain terminal (D) and the gate terminal (G) of the first amplifier element (T_1) of the serial connection.

10. A power amplifier as set forth in one of the claim 1, characterized in that from the first amplifier element (T_1) to the next to the last amplifier element (T_3) of the serial connection one limiting path (7', 7", 7'") each is connected between the drain terminal (D) and the gate terminal (G).

11. A power amplifier as set forth in claim 2, characterized in that with the exception of the output branch (11) at least one of the branches (10; 12) can be enabled or disabled corresponding to a desired output power of the power amplifier.

12. A power amplifier as set forth in claim 11, characterized in that a switching element (13) is located between the first adjustment network (3) and the gate terminal (G) of the first amplifier element (T_1) of the at least one branch (10; 12), where said switching element can be actuated according to the desired output power of the power amplifier.

13. A power amplifier as set forth in one of the claim 1, characterized in that the entire circuit of the power amplifier is designed in CMOS (Complementary Metal Oxide Semiconductor) technology.

14. A power amplifier as set forth in claim 2, characterized in that a switching element (8) for toggling the limiting path (7) between the conducting state and the blocking state is located in the limiting path (7).

15. A power amplifier as set forth in claim 14, characterized in that the switching element (8) is designed as a semiconductor switch (T_d).

16. A power amplifier as set forth in claim 15, characterized in that the semiconductor switch (T_d) is designed as a diode.

17. A power amplifier as set forth in claim 15, characterized in that the semiconductor switch (T_d) exhibits a switching path (DS) and a gate terminal (G) for switching the switching path (DS), whereby the gate terminal (G) is hot-wired to a drain terminal (D) of the semiconductor switch (T_d).

18. A power amplifier as set forth in one of the claim 2, characterized in that a resistor element (9) is located in the limiting path (7).

19. A power amplifier as set forth in one of the claim 2, characterized in that a limiting path (7) is connected only between the drain terminal (D) and the gate terminal (G) of the next to the last amplifier element (T_3) of the serial connection.

20. A power amplifier as set forth in one of the claim 2, characterized in that a first limiting path (7') is connected between the drain terminal (D) and the gate terminal (G) of the next to the last amplifier element (T_3) and an additional limiting path (7") between the drain terminal (D) and the gate terminal (G) of the first amplifier element (T_1) of the serial connection.

21. A power amplifier as set forth in one of the claim 2, characterized in that from the first amplifier element (T_1) to the next to the last amplifier element (T_3) of the serial connection one limiting path (7', 7", 7'") each is connected between the drain terminal (D) and the gate terminal (G).

22. A power amplifier as set forth in one of the claim 2, characterized in that the entire circuit of the power amplifier is designed in CMOS (Complementary Metal Oxide Semiconductor) technology.

* * * * *